United States Patent
Harris et al.

[11] Patent Number: 5,923,051
[45] Date of Patent: Jul. 13, 1999

[54] FIELD CONTROLLED SEMICONDUCTOR DEVICE OF SIC AND A METHOD FOR PRODUCTION THEREOF

[75] Inventors: Christopher Harris, Sollentuna; Mietek Bakowski, Skultuna; Ulf Gustafsson, Linköping; Mats Andersson, Stenungsund, all of Sweden

[73] Assignee: ABB Research Ltd., Zurich, Switzerland

[21] Appl. No.: 08/953,420

[22] Filed: Oct. 17, 1997

Related U.S. Application Data

[63] Continuation of application No. 08/637,305, Apr. 24, 1996, abandoned.

[51] Int. Cl.$^6$ .................. H01L 31/0312; H01L 29/74; H01L 31/111
[52] U.S. Cl. .................. 257/77; 257/133; 257/329; 257/345; 257/403
[58] Field of Search .................. 257/133, 329, 257/345, 402, 403, 77

[56] References Cited

U.S. PATENT DOCUMENTS 5,357,125  10/1994  Kumagi .................. 257/133
5,396,087   3/1995  Baligh .................. 257/139

FOREIGN PATENT DOCUMENTS 7-161983  6/1995  Japan .

OTHER PUBLICATIONS

Sze, Semiconductor devices, Physics and Technology, Copyright 1988, pp. 74 and 75.
Constapel et al., Trench–IGBTs with Integrated Diverter Structures, Proceedings of 1995 International Symposium on Power Semiconductor Devices & ICs, Yokohama, pp. 201–206.

*Primary Examiner*—Ngân V. Ngô
*Attorney, Agent, or Firm*—Pollock, Vande Sande & Amernick

[57] ABSTRACT

A field controlled semiconductor device of SiC comprises superimposed in the order mentioned at least a drain (12), a highly doped substrate layer (1) and a low doped n-type drift layer (2). It has also a highly doped n-type source region layer (6) and a source (11) connected thereto. A doped channel region layer (4) connects the source region layer to the drift layer, and a current is intended to flow therethrough when the device is in an on-state. The device has also a gate electrode (9). The channel region layer has a substantially lateral extension and is formed by a low doped n-type layer (4). The gate electrode (9) is arranged to influence the channel region layer from above for giving a conducting channel (17) created therein from the source region layer to the drift layer a substantially lateral extension.

10 Claims, 4 Drawing Sheets

FIELD CONTROLLED SEMICONDUCTOR DEVICE OF SIC AND A METHOD FOR PRODUCTION THEREOF

This application is a file wrapper continuation of U.S. patent application Ser. No. 08/637,305, filed Apr. 24, 1996, now abandoned.

BACKGROUND OF THE INVENTION

The present invention relates to a field controlled semiconductor device of SiC comprising superimposed, in the order mentioned, at least a drain, a highly doped substrate layer, and a low doped n-type drift layer. The device further comprises a highly doped n-type source region layer and a source connected thereto, a doped channel region layer connecting the source region layer to the drift layer and through which a current is intended to flow when the device is in an on-state. A gate electrode is arranged, upon applying a voltage thereto, to influence the charge carrier distribution of the channel region layer, and thereby the conductivity thereof, as well as a method for producing such a semiconductor device.

All type of field controlled semiconductor devices are comprised of, for example, field controlled transistors and field controlled thyristors.

Such semiconductor devices of SiC may especially be used as switching devices i power applications owing to the possibility of turning them on and off very rapidly. Such devices, made of SiC, are particularly well suited for high power applications, since such applications make it possible to benefit from the superior properties of SiC in comparison with especially Si, namely the capability of SiC to function well under extreme conditions. SiC has a high thermal stability due to a large bandgap energy, so that devices fabricated from material are able to operate at high temperatures, namely up to 1000 K. Furthermore, SiC has a high thermal conductivity, so that SiC devices may be arranged with a high density. SiC also has a more than five times higher breakdown field than Si, so that it is well suited to be the material in high power devices operating under conditions where high voltages may occur in the blocking state of a device.

Such field-controlled semiconductor devices may be divided into two main groups, namely so called normally-off devices and normally-on devices. This means that the channel region layer will have no conducting channel allowing electron transport from the source region layer to the drift layer when the gate electrode is laid on a zero potential, and that such a conducting channel is there when the gate electrode is laid on zero potential, respectively. Normally-off devices are more interesting and have more applications, since no voltage has to be applied to the gate electrode for cutting off the electron transport of the device, but the present invention covers both types of devices.

A field controlled semiconductor device of the type defined in the introduction is disclosed in U.S. Pat. No. 5,323,040. This device has vertical channel regions which are laterally restricted by trenches receiving a gate electrode. The channel region layer has to be very thin, in the order of a couple of $\mu$m, for creating a normally-off device. The trenches in this known device have to be created by etching, and it is very delicate to etch to obtain such thin layers, so that it is difficult and complicated to provide a device constructed in that way with a normally-off characteristic.

BRIEF SUMMARY OF THE INVENTION

The object of the present invention is to provide a field controlled semiconductor device of SiC of the type defined in the introduction, in which the problem of the prior art device described above is solved to a large extent and which may be produced by processing techniques suitable for SiC.

This object is, in accordance with the invention, obtained by providing a field controlled semiconductor device in which the channel region layer has a substantially lateral extension and is formed by a low doped n-type layer which further comprises a p-type base layer arranged under the low doped n-type channel region layer on the opposite side thereof with respect to the gate electrode to form an n-type conducting channel in the channel region layer at a distance from an upper surface of said channel region layer, and in which the gate electrode is arranged to influence the channel region from above for giving a conducting channel created therein from the source region layer to the drift layer a substantially lateral extension.

Because of the provision of the low doped n-type layer with a lateral extension as the channel region layer, it is possible to, without any problem, vary the thickness of the channel region layer according to the desired characteristics in the particular case, so that a normally-off device may be created just as well as a normally-on device. No fine lithography is required in the production of such a channel region layer as required for the prior art device discussed above. Said low doped n-type layer may, because of the lateral extension thereof, easily be created by epitaxial growth to an arbitrary thickness. The p-type base layer located under the n-type channel region layer will be used to deplete the channel region layer from one side and the gate electrode from the other side, and a normally-off device may be easily created, if desired, by appropriate choice of the width of the channel region layer, the gate electrode material and the doping concentration of the channel region layer and the base layer. This base layer also acts as a voltage blocking layer. Such a structure, which leads to the formation of a conducting channel at a distance from an upper surface of the channel region layer is very preferred, since the channel mobility equals bulk mobility due to the channel conduction being independent of the surface conditions of said channel region layer. This is an important advantage with respect to a conventional device, in which the conducting channel is created next to the surface and thus in regions having a considerably higher trap density than the bulk of the layer.

According to another preferred embodiment of the invention, the p-type base layer is highly doped. This facilitates the realization of a normally-off device and also makes it easier to turn a normally-on device off by depleting the entire cross-section area of the channel region layer between the base layer and the upper surface of the channel region layer. Furthermore, the device may, as a result of this characteristic, be able to take higher voltages.

According to another preferred embodiment of the invention, the gate electrode is insulated with respect to the channel region layer by an interposed insulating layer. This makes it possible to fabricate a field controlled semiconductor device of SiC having an insulated gate, but in which the conducting channel is not created at the interface between the insulating layer and the semiconductor layer, where the trap density is comparatively high, but at a distance therefrom in the bulk.

According to another preferred embodiment of the invention, the thickness and doping concentration of the low-doped channel region layer are coordinated with the doping concentration of the base layer, and the choice of the gate, so as to form a p-type depletion region in the channel region layer totally blocking the passage of electrons from the source region layer to the drift layer when a zero potential is laid on the gate electrode for making the device a normally-off device. A device having this preferred characteristic may, kin this way, easily be realized, essentially through the lateral extension of the channel region layer and the possibility to form it by epitaxial growth.

According to another preferred embodiment of the invention, the device is a MISFET having a highly doped n-type substrate layer, the low doped channel region layer is a part of the drift layer extending laterally between the insulating layer and the base layer, which is buried in the drift layer, for forming, upon application of a voltage to the gate electrode, of a conducting channel from the source region layer to the drift layer at the interface between the base layer and the channel region layer at a distance from the insulating layer. In this way, the acceptor-like traps formed as a result of the injection of electrons from the SiC into the insulating layer of conventional MISFETs, having a conducting inversion channel at the interface between the SiC layer and the insulating layer, will no longer be created. This is because the conducting channel is, in this device, formed in the bulk of the material, so that the channel will have a bulk carrier mobility rather than the degraded mobility of the interface channel, so that a lower on-state resistance is obtained. Removal of the insulating layer from the channel makes degradation of the insulating layer, due to injected charge, largely negligible.

According to other preferred embodiments of the invention, the device comprises a transistor and a thyristor, respectively. As a result, the field controlled semiconductor devices of SiC of these two types have advantageous features, especially low on-state losses. Also, a normally-off characteristic when desired, may be provided, which is desirable in different types of high power applications.

According to another preferred embodiment of the invention, the device comprises an additional highly doped n-type layer arranged to connect the low doped n-type channel region layer to the drift layer. Such a highly doped additional layer contributes to reducing the on-state losses of such a device.

According to another preferred embodiment of the invention, the source region layer and the additional n-type layer are arranged at a mutual lateral distance apart, leaving a part of the channel region layer exposed to a voltage of the gate electrode therebetween. In this way, it becomes easy to regulate the cross-sectional area of the conducting channel between the source region layer and the additional n-type layer and, if desired, cuts it totally off by varying the voltage applied to the gate electrode.

According to another preferred embodiment of the invention, the device comprises an additional highly doped p-type layer arranged laterally with respect to the low doped n-type channel region layer and positioned in contact with the source. Such a highly doped p-type layer is particularly advantageous when the device is a thyristor, since the electron current flowing from the source region layer into the drift layer creates an injection of holes into the drift layer from the substrate layer, and these holes may be efficiently collected by the highly doped p-type layer, thereby reducing the latchup problem of such a device.

A further object of the invention is to provide a method for producing a field controlled semiconductor device of SiC comprising one of a) a transistor and b) a thyristor, for which the disadvantages of the prior art device of this type is considerably reduced.

The method comprises according to the invention the steps of:

1) epitaxially growing on top of each other the following semiconductor layers of SiC: a highly doped substrate layer being a) of n-type and for b) of p-type, for b) on top thereof one of c) a highly doped n-type buffer layer and d) no such layer, and a low doped n-type drift layer,
2) implanting p-type dopants into a surface layer of the drift layer to form a p-type base layer,
3) epitaxially growing a low doped n-type channel region layer on top of the base layer,
4) etching away channel region layer to form a wall extending to the drift layer,
5) one of a) implanting n-type dopants into a surface layer of the channel region layer and b) epitaxially growing an n-type layer onto the channel region layer, to form a highly doped n-type source region layer,
6) one of a) implanting n-type dopants into the channel region layer at a lateral distance from the source region layer and in connection with the wall and into the wall and b) epitaxially growing an n-type layer onto the channel region layer at a lateral distance from the source region layer and in connection with the wall and on the wall form an additional n-type layer extending from the channel region layer to the drift layer,
7) applying a gate electrode on the channel region layer between the source region layer and the additional n-type layer and a source on source region layer, the steps 4) and 5) being carried out in one of the following orders: a) 4) and then 5) and b) 5) and then 4).

By using this method, field controlled transistors and thyristors of SiC with a lateral conducting channel and the same preferred characteristics as those previously mentioned may be produced. By using regrowth on an implanted layer the low doped n-type channel region layer may easily be given an arbitrary thickness and also be made very thin when so desired, at the same time as the base layer created by an implantation step may be provided at an arbitrary depth. The diffusitivity of different dopants in SiC is dramatically reduced with respect to Si, but in this way it will be possible to obtain a layer buried in a layer with another type of doping by using the implantation technique and without damaging the upper one of the layers.

Another method through which the object of the present invention may be obtained comprises the following steps for producing a field controlled semiconductor device of SiC being one of a) a transistor and b) a thyristor:

1) epitaxially growing on top of each other the following semiconductor layers of SiC: a highly doped substrate layer being for a) of n-type and for b) of p-type, for b) on top thereof one of c) a highly doped n-type buffer layer and d) no such layer, and a low doped n-type drift layer,
2) etching a groove into the drift layer,
3) epitaxially growing a p-type base layer in the groove,
4) epitaxially growing a low doped n-type channel region layer on top of said base layer and a surface of said drift layer located laterally to said base layer,
5) etching away the channel region layer at a lateral distance from one lateral border of the base layer while forming a wall of the channel region layer,
6) one of a) implanting n-type dopants into the channel region layer at a lateral distance from the border and in connection with the wall and into the wall and b) epitaxially growing an n-type layer on the channel region layer at a lateral distance from the border and in connection with the wall and onto the wall to form a highly doped n-type source region layer, 7) applying a gate electrode on the channel region layer in the lateral direction between the source region layer and the border and a source on the source region layer.

This method constitutes another preferred way to form a device having the preferred characteristics mentioned above. Here the base layer is obtained by an epitaxial regrowth in the etched groove with the channel region layer epitaxially grown on top thereof.

Another method through which the object of the present invention may be obtained comprises the following steps for producing a field controlled semiconductor device of SiC in the form of a MISFET:

1) epitaxially growing on top of each other the following semiconductor layers of SiC: a highly doped n-type substrate layer and a low doped n-type drift layer, 2) forming a buried p-type base layer in the drift layer by one of a) implanting p-type dopants with such an energy that a buried implanted base layer is formed at a distance from the upper surface of the drift layer and b) implanting p-type dopants into a surface layer of said drift layer and after that epitaxially growing a further portion of the drift layer thereupon for forming a buried p-type base layer, the base layer being formed so that a vertical portion of the drift layer passes it laterally on a first side, 3) implanting n-type dopants into a surface layer of the drift layer over said base layer at a distance from first side for forming a highly doped source region layer, 4) applying an insulating layer with an electrode thereon on the portion of the drift layer located above the p-type base layer and a source on the source region layer.

By combining the implantation of the p-type dopants into the drift layer with a subsequent epitaxial growth of a further portion of the drift layer thereupon, a buried base layer may, without any problems, be formed in a MISFET of SiC, so that a conducting channel created therein will be at a distance from the interface to said insulating layer and the carrier mobility will be considerably higher than in known MISFETs of SiC.

Further advantages and preferred features of the invention will appear from the description and other claims.

BRIEF DESCRIPTION OF THE DRAWINGS

With reference to the appended drawings, below follows a specific description of preferred embodiments of the invention cited as examples.

DETAILED DESCRIPTION OF THE INVENTION

Figure 1:
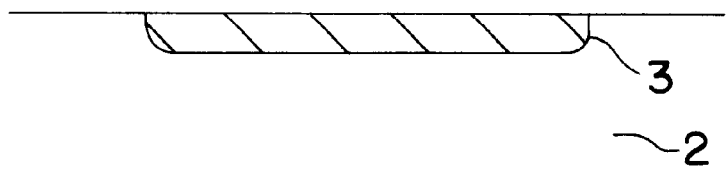
FIGS. 1 through 4 are schematic cross-section views illustrating different steps of a method for producing a field controlled transistor according to FIG. 4.
Figure 2:
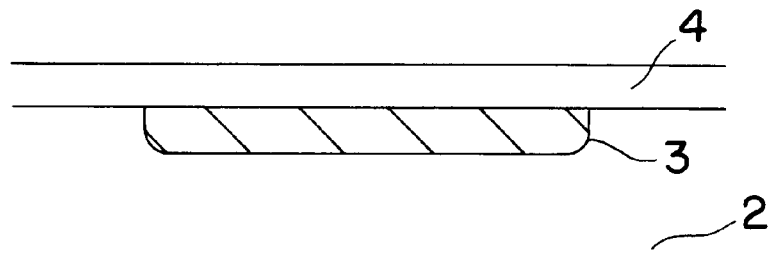
Figure 3:
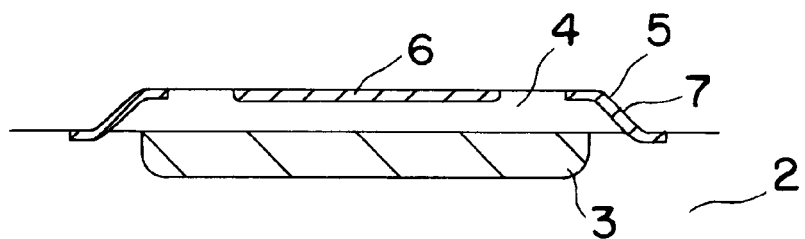
Figure 4:
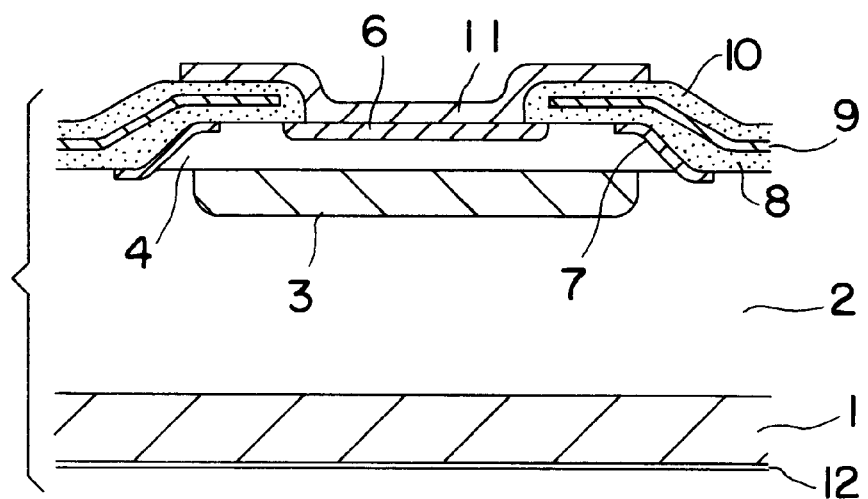

A method for producing a field controlled transistor having a channel region layer with a substantial lateral extension will now be described with reference to FIGS. 1 through 4.

Conventional semiconductor devices producing steps having nothing to do with the invention, such as masking, demasking and so on, have, for the sake of clarity, not been shown in the drawings. First a highly doped n-type substrate layer 1, and on top thereof, a low doped n-type drift layer 2 are epitaxially grown (see FIG. 4). After that, p-type dopants, preferably aluminum or boron, are implanted into the surface layer of the drift layer to form a highly doped p-type base layer 3.

That step is followed by a step of epitaxial growth (see FIG. 2) of a low doped n-type channel region layer 4 on top of the base layer. This channel region layer 4 has preferably a very low doping concentration, so that it may easily be depleted for forming a blocking depletion layer therein, which will be described further below. This epitaxial growth is preferably carried out by using the Chemical Vapor Deposition technique involving a high temperature, preferably above 1500° C., and an annealing of the implanted layer 3 may be carried out in connection thereto by raising the temperature to 1700° C. or more for making the dopants implanted electrically active.

After that a MESA-etch is carried out in the channel region layer 4, a wall 5 extending to the drift layer 2. Then n-type dopants are implanted into the surface layer of the channel region layer 4 for forming a highly doped n-type source region layer 6. Also, n-type dopants are implanted into the channel region layer 4 at a lateral distance from the source region layer and in connection with the wall, and into said wall, and into a surface layer of the drift layer for forming an additional n-type highly doped layer 7 extending from the surface of the channel region layer 4 to the drift layer 2.

This step is necessarily followed by an annealing step for making n-type dopants implanted electrically active. The implantation for forming the source region layer 6 may, as an alternative, be carried out separately before the etching step.

An insulating layer 8, for instance of $SiO_2$, with a gate electrode 9 thereon, is applied on the channel region layer with an extension between the source region layer and the additional n-type layer. The gate electrode is preferably of poly-crystalline silicon. After that, a passivating, additional insulating layer 10 is applied over the gate electrode and the upper surface of the device, leaving an area of the source region layer 6 exposed and a source 11 is then applied on the layer 6. Finally, a drain contact 12 is applied to the substrate layer 1.

Figure 5:
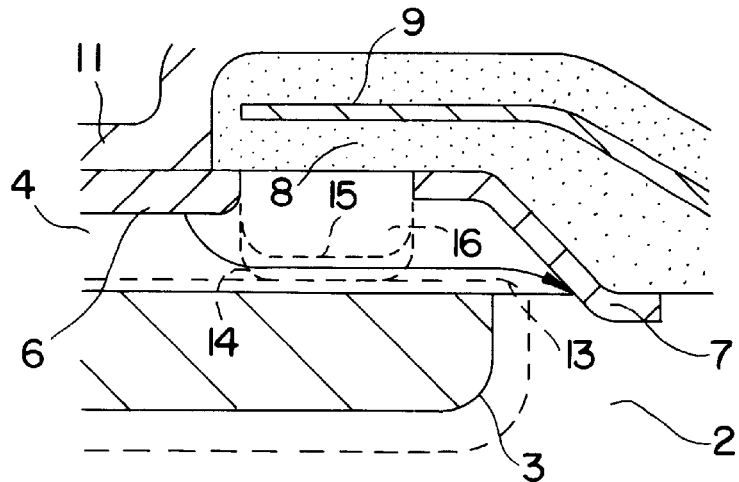
FIG. 5 is an enlarged cross-section view of primarily the channel region layer of the transistor in FIG. 4, which illustrates how the cross-section area of the conducting channel may be varied.
Figure 6:
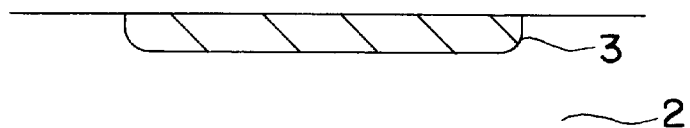
FIGS. 6 through 9 are views corresponding to FIGS. 1 through 4 illustrating different steps of a second method according to the invention for producing a field controlled thyristor illustrated in FIG. 9.
Figure 7:
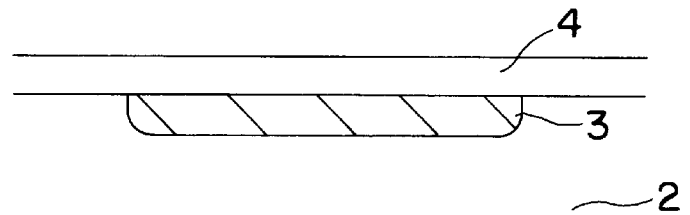
Figure 8:
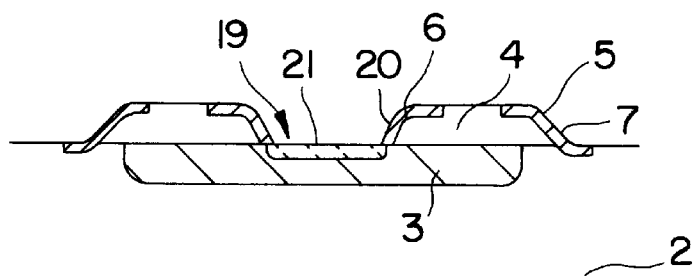
Figure 9:
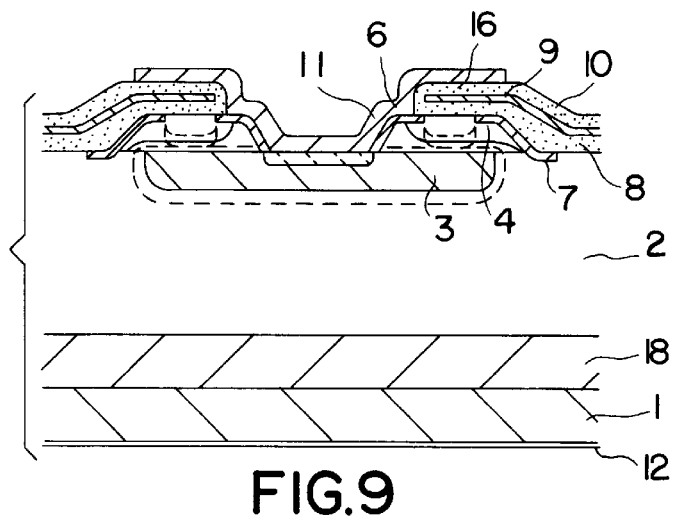

The function of this field controlled transistor will now be described with reference made to FIG. 5. This transistor may be of a normally-off type as well as a normally-on type.

Assuming that it is of the normally-off type, which may be achieved by appropriately choosing the thickness and doping concentration of the channel region layer 4, the gate electrode material and the doping concentration of the base layer 3. A lower doping concentration of the channel region layer 4 and a higher doping concentration of the base layer 3, as well as an appropriate choice of the gate electrode material will make it possible to increase the thickness of the channel region layer and still obtain a normally-off device. The gate electrode 9 will deplete the channel region layer located thereunder according to a dashed line having the lower extension 14 when a zero potential is laid on the gate electrode 9, and the base layer 3 from below according to the dashed line 13, so that a depleted layer 16 is formed between the source region layer 6 and the additional n-type layer 7 blocking an electron transport from the source region layer to the drift layer. Application of a positive voltage to the gate electrode 9 will move the lower extension 14 of the layer, depleted by the gate electrode, upwardly, and the extension 15 corresponds to a certain level of the voltage applied on the gate electrode 9. In this way, a lateral conducting n-type channel 17 is created between the source region layer 6 and the layer 7, and this conducting channel is located at a considerable distance from the upper surface of the channel region layer 4 resulting in a channel mobility equaling bulk mobility due to the channel conduction being independent on the surface conditions, so that the on-state losses of such a device will be very low with respect to, for instance, a conventional MISFET. Because of the possibility of creating a channel region layer 4 by epitaxial growth, which may be realized by conventional techniques thanks to the lateral extension thereof, this may be made arbitrarily thick, which means that it may be easily made very thin for the production of a normally-off device. Such a device may, of course, also be made as a normally-on device, so that a voltage of opposite sign to that according to that mentioned above has to be applied to the gate electrode for eliminating the conducting channel 17.

FIGS. 6 through 9 illustrate the different steps for producing a field controlled thyristor according to the second preferred embodiment of the invention. This method comprises the same steps as the method described above with reference to FIGS. 1 through 4 except for the initial growth of a highly doped p-type substrate layer 1, and a highly doped n-type buffer layer 18 (this layer is optional) on top thereof, and the additional step illustrated in FIG. 8 of etching a trench 19 into the channel region layer 4 to form a wall 20. The step of implanting n-type dopants for forming a source region layer 6 is then carried out by implanting the n-type dopants into the channel region layer 4 into the wall 20 thereof and laterally in the direction of the additional highly doped n-type layer 7 while leaving a lateral distance between the two layers 6 and 7. Furthermore, p-type dopants are implanted in the bottom of the trench 19 forming an additional highly doped p-type layer 21 in a surface region of the base layer 3. When the source is applied, this is also applied in contact with the additional p-type layer 21. This additional layer 21 will collect the holes injected into the drift layer 2 from the substrate layer 1 as a consequence of the electron current flowing from the source to the drain in the on-state of the device. A field controlled transistor may be produced in the same way whit the exception that the p-type substrate layer is replaced by an n-type substrate layer and the buffer layer will not be there. It is then also possible to omit the additional highly doped p-type layer. The function of this device with respect to the formation of a lateral conducting channel in the channel region layer near the interface to the base layer will be the same as discussed above for the field controlled semiconductor device shown in FIG. 4.

Figure 10:
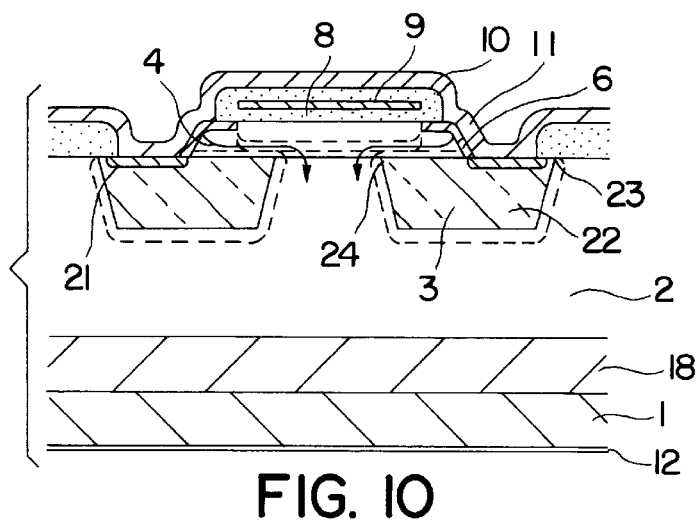
FIG. 10 is a schematic cross-section view of a field controlled thyristor according to a third preferred embodiment of the invention.

FIG. 10 illustrates a field controlled thyristor according to a third preferred embodiment of the invention, which has been produced by carrying out the following steps: epitaxially growing on top of each other the following semiconductor layers of SiC: a highly doped p-type substrate layer 1, a highly doped n-type buffer layer 18 and a low doped n-type drift layer 2. A groove 22 is then etched into the drift layer. Two devices produced in a mirror image relation are shown in FIG. 10, so that two such grooves 22 are realized. A p-type base layer 3 is epitaxially grown in the groove, and after that a low doped n-type channel region layer 4 is epitaxially grown on top of the base layer and a surface of the drift layer located laterally to said base layer. After that, the channel region layer is etched away at a lateral distance from a first lateral border 23 of the base layer 3. N-type dopants are after that implanted in to the channel region layer at a lateral distance from the border and in connection with a wall formed by the etching and into the wall for forming a highly doped n-type source region layer 6. P-type dopants are after that implanted into a surface layer of the base layer 3 form an additional highly doped p-type layer 21. Then an insulating layer 8 with a gate electrode 9 thereon is applied on said channel region layer between the source region layer and a second lateral border 24 of the base layer opposite to the first one. Finally, a passivating additional insulating layer 10 is applied over the gate electrode and the upper surface of the device leaving an area of source region layer 6 and highly doped additional p-type layer 21 exposed, and a source 11 is then applied on these two layers. The layers 6 and 21 could alternatively be created by epitaxial growth instead of implantation.

Figure 11:
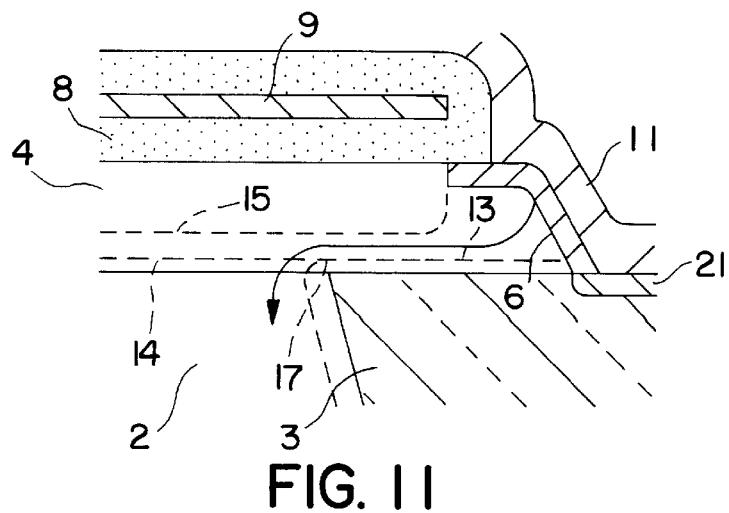
FIG. 11 is an enlarged cross-section view of the channel region layer of the thyristor according to FIG. 10 illustrating how the cross-section area of the conducting channel may be varied.

The function of this device, which by leaving out the lower layer 1, could be a transistor instead of a thyristor, will appear from the previous description of the other preferred embodiments of the invention, but it is illustrated in FIG. 11 how a conducting channel 17 for conducting electrons from the source region layer to the drift layer may be created and how the width thereof may be varied by varying the voltage applied to the gate electrode. It indicates how a depleted layer 16 is formed and how this will cut the path for electrons from the source region layer 6 to the drift layer off in a position 14 of the portion depleted by the gate corresponding to a certain voltage applied to the gate electrode 9, which in the normally-off case will be a zero potential, and a conducting lateral channel 17 is formed in another position 15 corresponding to another voltage applied to the gate electrode. The advantages of this structure appear from the description above and are strongly dependent on the fact that the low doped channel region layer is created by epitaxial growth.

Figure 12:
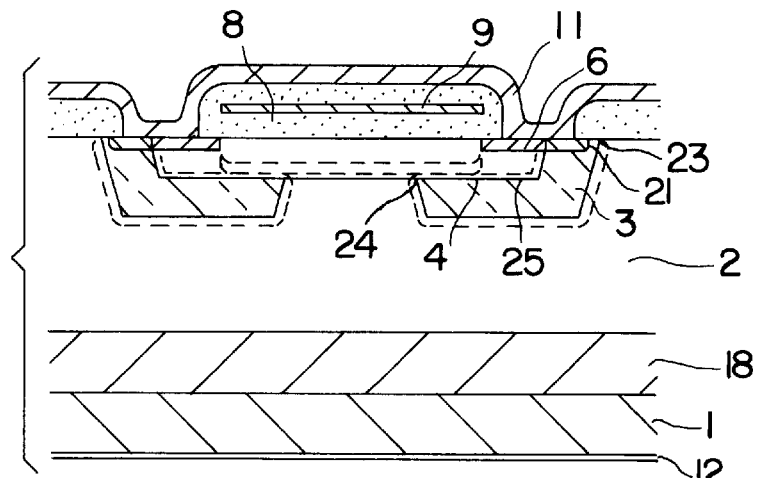
FIG. 12 is a schematic cross-section view of a field controlled thyristor according to a fourth preferred embodiment of the invention.

FIG. 12 illustrates a field controlled thyristor according to a fourth preferred embodiment of the invention, which may be produced by a method which includes the same initial steps as the method previously described, but after the epitaxial growth of the base layer 3 a second groove 25 is etched into the base layer at a lateral distance from a first lateral border 23 thereof and beyond an opposite second lateral border 24 thereof. After that, a low doped n-type channel region layer 4 is grown into this second groove 25. The rest of the steps are the same as in the method previously described with the exception that the source region layer 6 has a lateral extension due to the planar structure. Two different extensions of a blocking depleted layer 16, formed in the channel region layer corresponding to two different voltages applied to the gate electrode 9, are indicated by dashed lines, and the function of the device is clear from what has been said above.

Figure 13:
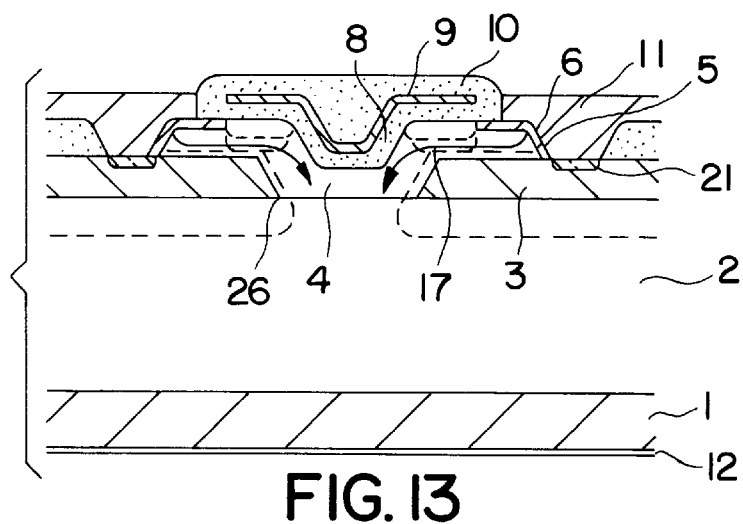
FIG. 13 is a schematic cross-section view of a field controlled transistor according to a fifth preferred embodiment of the invention and in which a way of varying the cross-section of the conducting channel has been illustrated.

A field controlled transistor according to a fifth preferred embodiment of the invention is schematically illustrated in FIG. 13. In the method for producing this transistor, the substrate layer 1, the drift layer 2 and the highly doped p-type base layer 3 are epitaxially grown on top of each other. After that, a groove 26 is MESA-etched through the base layer to the drift layer. A low doped, n-type channel region layer is, after that, epitaxially grown on top of the base layer and in groove 26. The channel region layer is etched to form a wall 5, and a highly doped n-type source region layer 6 is created by implantation into that wall. The rest of the steps are as described above, and the different elements have been indicated by the same reference numbers as before. A depletion layer in two different positions corresponding to two different voltages applied to the gate electrode 9 as well as a lateral conducting channel 17 created in one of the positions are indicated by dashed lines.

Figure 14:
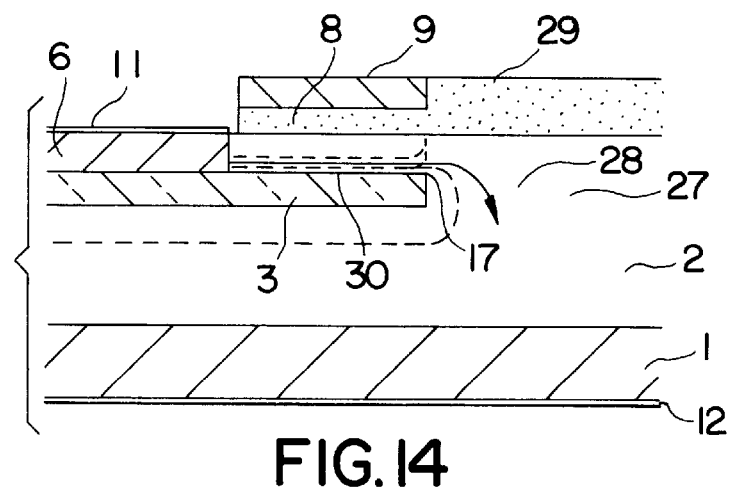
FIG. 14 is a schematic cross-section view of a MISFET according to a sixth preferred embodiment of the invention, illustrating how the conducting channel may be formed and the cross-section area thereof may be varied.

FIG. 14 illustrates a MISFET according to a sixth preferred embodiment of the invention, and this is created by carrying out the following steps: A highly doped substrate layer 1 and a low doped n-type drift layer 2 are epitaxially grown on top of each other. A buried p-type base layer 3, which preferably is highly doped, is then created by implanting p-type dopants with such an energy that a buried implanted base layer is formed at a distance from the upper surface of the drift layer, or better by implanting p-type dopants in a surface layer of the drift layer and, thereafter epitaxially growing a further portion of the drift layer thereupon for forming a buried p-type base layer. This further portion may then preferably be made lower doped than the rest of the drift layer.

The base layer is formed so that a vertical portion 27 of the drift layer 2 passes it laterally on a first side 28 thereof. N-type dopants are thereafter implanted into a surface layer of the drift layer over base layer at a distance from the first side for forming a highly doped source region layer 6. As a result, an insulating layer 8 with a gate electrode 9 thereon are applied on a portion of drift layer located above p-type base layer, and a source 11 is applied on the source region layer. A mask oxide layer 29 is also shown in the figure. By appropriately doping the base layer 3 and the further portion of the drift layer, selecting the thickness of this portion 30 of the drift layer between the base layer and the insulating layer as well as choosing the gate this device may be normally-off, i.e., a p-type depletion layer will be formed in said portion 30 and covering the entire cross-section thereof. If a voltage over a threshold voltage is applied to the gate electrode, a conducting lateral channel is created from the source region layer to the vertical portion 27 of the drift layer 2 along and at a distance above the interface between said portion 30 and the base layer 3. As a bulk channel, this channel will have a bulk carrier mobility rather than the degraded mobility of an inversion channel formed at the interface to the insulating layer, where there will be a considerably higher trap density. Thus, the on-state resistance of this device will be considerably lower than that of a conventional MISFET.

MISFET is here defined as covering field effect transistors having an insulated gate, such as MOSFETs.

The low doped n-type channel region layer in the devices according to the different embodiments of the invention described above will, except the embodiment described in FIG. 14, preferably have a doping concentration below or well below that of the drift layer, so that it will easily be depleted for controlling the conductivity thereof and making it possible to form a normally-off device. This doping concentration may go down to the order of $10^{14} cm^{-3}$ or less.

The invention is not in any way restricted to the preferred embodiments described above, but many possibilities to modifications thereof will be apparent for one skilled in the art without departing from the basic ideas of the invention.

It is emphasized that the thicknesses of different layers in the figures cannot be interpreted as limiting the scope of the protection, but any thickness relations are intended to be covered by the claims.

The dopants used may be of any material suitable as dopants for this application.

The number of layers mentioned in the claims is a minimum number, and it is within the scope of the invention to arrange further layers in the devices or dividing any layer into several layers by selective doping of different regions thereof. Especially, the drift layer may comprise sublayers of different doping concentration, such as particularly low doping concentration close to the base layer.

Although it has been shown that the gate electrode is insulated, the invention is not restricted thereto, but it may also be diffused, i.e., a so-called bipolar gate being highly doped, which however is not that advantageous, since it will then take current.

"Substrate layer" is in this disclosure to be interpreted as the layer closest to the drain of the layers mentioned and it does not have to be a substrate layer in the strict sense of this word within this field, i.e., the layer from which the growth is started. The real substrate layer may be any of the layers and is mostly the thickest one, which may be the drift layer.

The method claims are to be interpreted as not restricted to a growth of the layers located on top of each other in the order they are mentioned, but any other order of growth of these layers is within the scope of the claims. For instance, the method may be started from the drift layer and the so-called substrate layer and the drain may be grown at the very end of the method.

We claim:

1. A field controlled SiC semiconductor device comprising:

a highly doped substrate having a drain on one side thereof;

a low doped n-type drift layer disposed on an opposite side of said substrate;

a p-type base layer formed above said n-type drift layer;

a low doped n-type channel region laterally extending over said p-type base layer and in contact therewith; and a source layer above a portion of said low doped n-type channel region;

a source connected to said source layer;

a gate electrode formed over said channel region and laterally spaced from said source layer, said channel region separating said gate electrode from said base region, said gate electrode and said base region forming respective depletion boundaries in said channel region, said depletion boundaries being movable from a substantially coinciding position forming a continuous depletion region to a spaced apart position forming a conducting channel between said source layer and drift layer depending on the potential on said gate electrode.

2. A device according to claim 1, wherein said p-type base layer is highly doped.

3. A device according to claim 1, wherein said gate electrode is insulated from the channel region layer by an insulating layer interposed therebetween.

4. A device according to claim 1, wherein the thickness and doping concentration of the low doped channel region layer are adapted to the doping concentration of said base layer and the gate so as to form a p-type depletion region in the channel region layer totally blocking the passage of electrons from said source region layer to the drift layer when a zero potential is applied to the gate electrode for making the device a normally-off device.

5. A device according to claim 1, wherein said device is a MISFET having a highly doped n-type substrate layer, said low doped n-type channel region layer is a part of the drift layer extending laterally inbetween an insulating layer of said gate electrode and said base layer, which is buried in the drift layer, for forming, upon applying a voltage to said gate electrode, a conducting channel from the source region layer to the drift layer at the interface between the base layer and said channel region layer at a distance from said gate electrode insulating layer.

6. A device according to claim 1, having a highly doped n-type substrate layer forming a transistor.

7. A device according to claim 1, wherein said device is a thyristor and that said device has a highly doped p-type substrate layer and a highly doped n-type buffer layer.

8. A device according to claim 1, wherein said device further comprises an additional highly doped n-type layer arranged to connect said low doped n-type channel region layer to the drift layer.

9. A device according to claim 8, wherein the source region layer and said additional n-type layer are arranged at a lateral distance leaving a portion of said channel region layer exposed to a voltage of said gate electrode therebetween.

10. A device according to claim 1, wherein said device comprises an additional highly doped p-type layer arranged laterally with respect to the low doped n-type channel region layer and in contact with the source.

* * * * *